Feb. 12, 1963 H. J. RIBLET 3,077,565

MICROWAVE FREQUENCY DISCRIMINATOR

Filed Oct. 5, 1959 2 Sheets-Sheet 1

INVENTOR.
HENRY J. RIBLET
BY
Joseph Weingarten
ATTORNEY

INVENTOR.
HENRY J. RIBLET
BY Joseph Weingarten
ATTORNEY

United States Patent Office 3,077,565
Patented Feb. 12, 1963

3,077,565

MICROWAVE FREQUENCY DISCRIMINATOR

Henry J. Riblet, 35 Edmunds Road, Wellesley, Mass.

Filed Oct. 5, 1959, Ser. No. 844,581
4 Claims. (Cl. 329—116)

This invention relates in general to frequency sensitive microwave apparatus and more particularly to a frequency discriminator employing a waveguide hybrid junction to transmit energy to a pair of power sensing devices, such as crystal rectifiers, which develop a voltage proportional to frequency deviation of the input signal from a reference frequency. The invention incorporates a mechanism which permits the reference frequency $f_0$ to be varied and the invention is so constructed that the necessity of having an apparatus which must be rebalanced or adjusted as the frequency of operation is varied is eliminated. The invention is an intrinsically balanced microwave discriminator.

Frequency discriminators of various designs are well known in the electronic circuitry art. The principle of operation usually employed in prior discriminators, in general, requires that the incident radiation whose frequency deviation is to be measured be divided between two radio frequency transmission paths. The two transmission paths introduce phase shifts which vary with frequency in a different manner for each path. In this way, a frequency dependent phase shift between the two signal transmission paths is established. By employing a phase sensitive detector in each of the signal transmission paths, an output dependent upon the relative phase shift, i.e., a frequency discriminator pattern, is obtained. A typical frequency discriminator employing this principle of operation is described in Patent No. 2,041,855, issued May 26, 1936, to R. S. Ohl. An improved frequency discriminator utilizing this principle of operation is the Foster-Seeley discriminator, which has been extensively described in the technical literature. Frequency discriminators of the Ohl and Foster-Seeley types are, in essence, balanced phase detectors and are sometimes termed "phase discriminators."

A second type of discriminator which is widely known employs two tuned circuits, the resonant frequency of one circuit lying above the reference frequency and the resonant frequency of the other circuit lying below the reference frequency. When both of those resonant circuits are simultaneously excited by an input signal, the difference between the detected excitation in the separate circuits is indicative of the frequency deviation of the input signal from the reference frequency. This type of discriminator is known as a staggered-tuned discriminator.

Both the phase discriminator and the staggered-tuned discriminator have been made in forms suitable for microwave frequencies. The phase detector type of discriminator has been described by L. C. Rideout in a paper published in the proceedings of the I.R.E. of August 1947 on page 767. The device disclosed by Rideout requires a phase adjustment to obtain the proper phase relationship between the signals in the two separate transmission paths, one path being essentially a broad band circuit and the other path being a narrow band circuit whose phase and amplitude transmission characteristics are determined by a high-Q resonant cavity. Thus, where it is desired to operate the phase discriminator of Rideout at different frequencies, a separate phase adjustment has to be made at each different frequency in order to obtain the proper discriminator signal.

A staggered-tuned discriminator designed to be used at microwave frequencies is disclosed in Patent No. 2,502,456, issued to W. W. Hansen. That patent discloses the use of a dual-mode cavity resonator to stabilize the frequency of a microwave source. Dual-mode cavities are inherently complex devices, difficult to design and costly to build, and consequently, the utilization of dual-mode cavities has been restricted to specialized equipment where no suitable, less costly, alternative apparatus is available.

The difficulties and disadvantages associated with the foregoing types of microwave discriminators are overcome by the invention here disclosed. A device constructed in accordance with the invention, inherently provides the proper phase relationship by the geometry of the actual microwave circuitry so that no phase adjustment is necessary when the reference frequency of the discriminator is changed. The invention may employ a waveguide hybrid junction of a type known as the "short slot hybrid," described in Patent Nos. 2,739,287 and 2,739,288, both issued on March 20, 1956, to H. J. Riblet. The short slot hybrid junction has the characteristic of dividing an input signal and furnishing equal amplitude outputs with a 90° phase shift between the two outputs. This characteristic is maintained over an exceedingly broad spectrum of input frequencies. The short slot hybrid junction is designed to support propagation in the $TE_{10}$ and $TE_{20}$ modes in the apertured section of the junction. The energy in an input signal applied to a short slot hybrid junction is divided in the apertured section between the $TE_{10}$ and $TE_{20}$ modes. It is known that in the apertured section, the phase velocity of the $TE_{10}$ mode is greater than the phase velocity of the $TE_{20}$ mode. Thus, the length of the apertured section may be selected to give equal outputs from the two output ports. In the invention, the energy in either the $TE_{10}$ or the $TE_{20}$ modes is coupled through a slot in the apertured section to a resonant cavity. Assuming that the energy in the $TE_{10}$ mode is coupled to the resonant cavity, the phase of the $TE_{10}$ mode relative to the phase of the $TE_{20}$ mode becomes a function of frequency. When the frequency of the energy in the $TE_{10}$ mode is at the resonant frequency of the cavity, the cavity does not affect the phase of the transmitted signal of the $TE_{10}$ mode. On the other hand, when the frequency of the energy in the apertured section of the hybrid junction is below the resonant frequency of the cavity, the phase of the energy in the $TE_{10}$ mode is advanced or delayed. Conversely, when the frequency of the energy in the apertured section of the hybrid junction is above the resonant frequency of the cavity, the phase of the energy in the $TE_{10}$ mode is delayed or advanced. The signal obtained at each output port of the hybrid junction is the resultant or the vector sum of the energy in the $TE_{10}$ mode and the $TE_{20}$ mode. Consequently, by varying the phase of the energy in one mode with respect to the phase of the energy in the other mode, a change is caused in the relative power levels at the two output ports. A pair of crystal detectors is employed to detect the levels of the signals obtained from the two output ports. When the frequency of the input signal is at the resonant frequency of the cavity, the currents in the two crystals are equal. However, where the frequency of the input signal is below the resonant frequency, the current in one crystal exceeds the current in the other crystal, and if the frequency of the input signal is above resonance, the situation with regard to the currents in the two crystals is reversed. By measuring the difference between the currents in the two crystals, the characteristic S curve of a frequency discriminator is obtained as a function of frequency.

The primary object of this invention is to provide an intrinsically balanced microwave frequency discriminator of simple design which achieves the requisite phase relationship from the geometry of the microwave components employed, and requires no phase adjustment even though the reference frequency of the discriminator may be tuned through a broad spectrum of frequencies by adjustment of a resonant cavity.

The arrangement of the invention together with its manner of operation may be better apprehended by reference to the following detailed description when considered in conjunction with the accompanying drawings in which.

Figure 1:
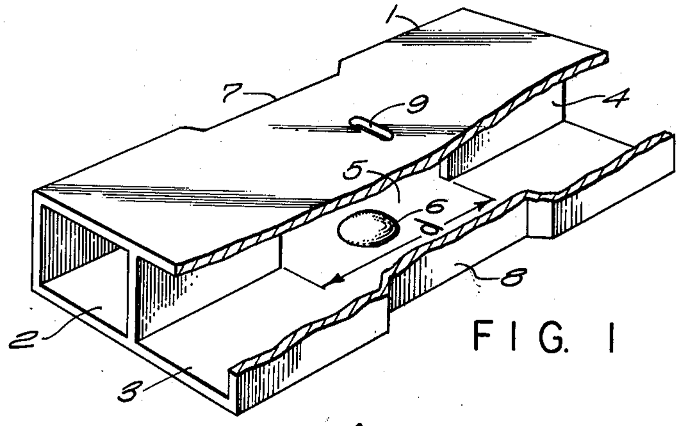
FIG. 1 is a perspective view of a short slot hybrid junction, a portion of the hybrid having been cut away to show its interior construction.

Referring now to FIG. 1 of the drawings, there is shown a hybrid junction 1 exemplifying the type of coupler known as the "short slot" hybrid junction. The short slot hybrid junction is composed essentially of a pair of contiguous waveguides 2 and 3 symmetrical about a common narrow wall 4 in which an aperture 5 is provided between the two waveguides by removing substantially all of the common wall for a distance *d* equal to approximately one "free space" wave length of the mean operational frequency of the junction. The portion of the hybrid 1 containing the aperture 5 is denoted as the "apertured section," the length of the apertured section being the distance *d*. On the lower broad wall in the center of the apertured section there is preferably provided a "wave length reducing" capacitive dome-like button 6 which projects upwardly into the central portion of the hybrid 1. The two narrow walls of the hybrid 1 preferably have "wave length increasing" inductive indentations 7 and 8 which decrease the width of the broad walls in the apertured section.

Figure 2:
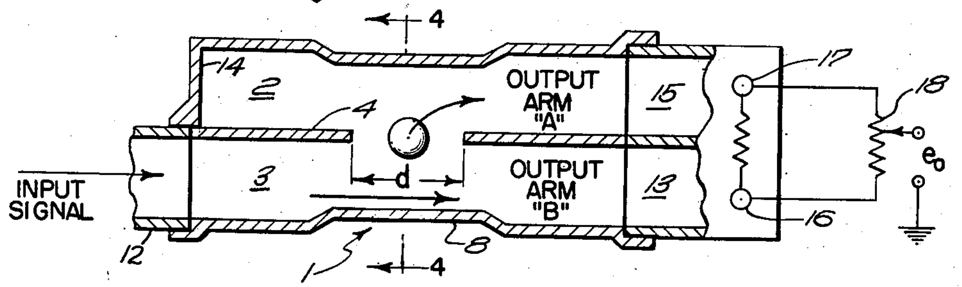
FIG. 2 is a sectional view of a microwave frequency discriminator constructed in accordance with the invention.
Figures 3, 4:
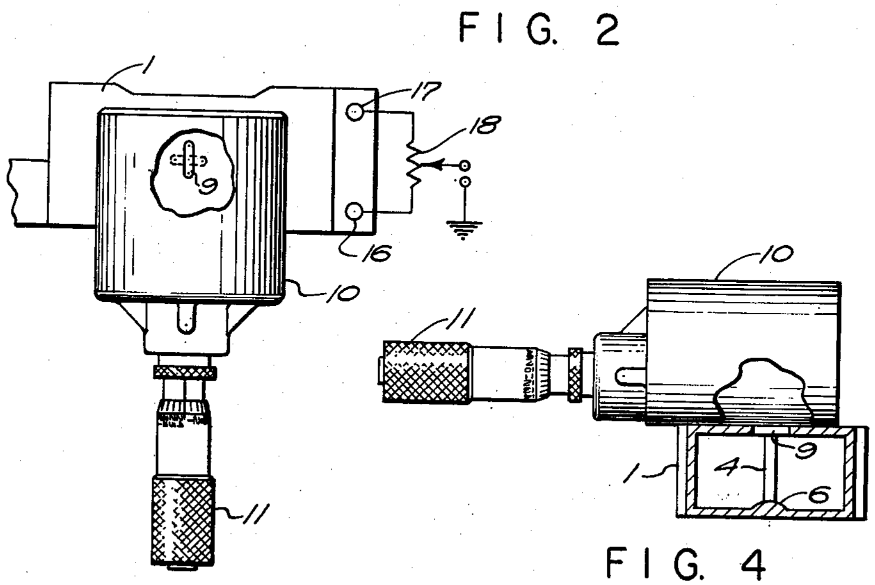
FIG. 3 is a top plan view of the invention with a portion of the resonant cavity broken away to show the coupling between the hybrid junction and the cavity.
FIG. 4 is a vertical sectional view of the hybrid junction taken along the line 4—4 of FIG. 2, a portion of the superposed resonant cavity being broken away to illustrate the slot coupling the cavity to the hybrid junction.

A frequency discriminator constructed in accordance with the invention is depicted in FIGS. 2, 3, and 4. A tunable cavity resonator 10 having a shaft 11 permitting fine tuning of the resonant frequency of the cavity is shown in FIGS. 3 and 4, the resonator cavity being superposed on the broad wall of the short slot hybrid junction 1. The apertured section of hybrid 1 is provided with a coupling slot 9, as best shown in FIG. 1, cut in the broad wall directly above the capacitive button 6. The slot 9, also depicted in FIGS. 3 and 4, couples energy from the apertured section of the hybrid into the resonant cavity 10.

For the purpose of exposition, it is convenient to consider the short slot hybrid junction depicted in FIG. 2 as consisting of two identical parallel waveguides 2 and 3 having a length of the common wall 4 removed. Input signals are introduced into the hybrid 1 through an input waveguide 12 connected to one end of waveguide 3, the other end of waveguide 3 being connected to an output waveguide 13. The waveguide 2 is terminated at its input end preferably by a matched termination 14 which absorbs any energy reflected into that arm of the waveguide, the output arm of waveguide 2 being connected to an output waveguide 15. Crystal detectors 16 and 17 are disposed in the output waveguides 13 and 15 respectively to detect the levels of the signals present therein.

Figures 5, 6:
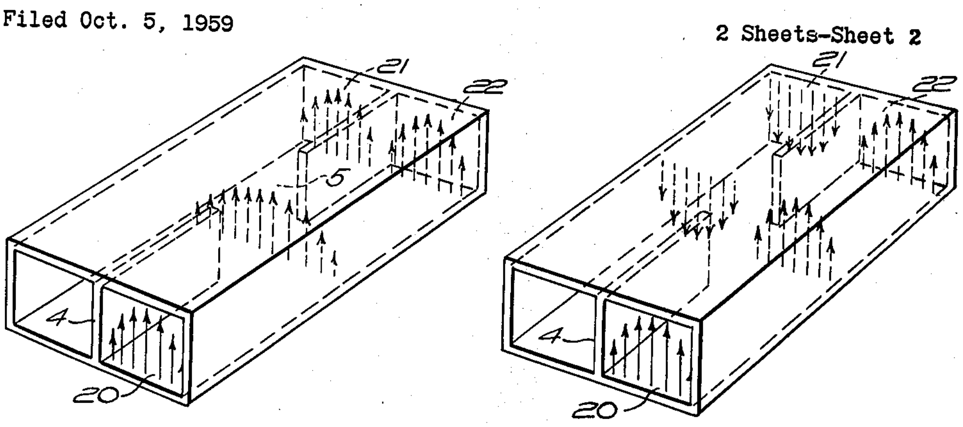
FIG. 5 illustrates the symmetrical $TE_{10}$ mode in a short slot hybrid junction.
FIG. 6 illustrates the anti-symmetrical $TE_{20}$ mode in a short slot hybrid junction.
Figures 7, 8:
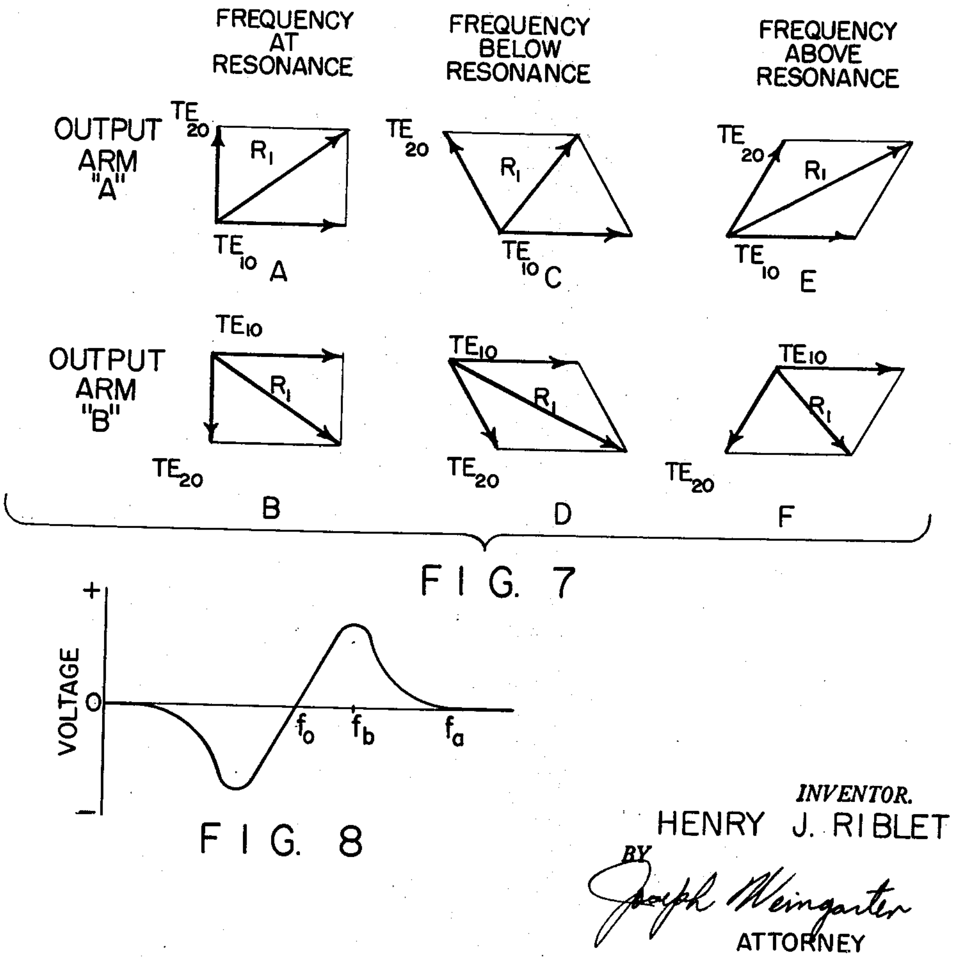
FIG. 7 shows vector diagrams pertaining to the operation of the invention.
FIG. 8 is a graphical representation of the characteristic S curve output of the frequency discriminator showing the manner in which the discriminator output varies in relation to the frequency of the input signal.

It is a characteristic of the short slot hybrid junction that energy applied to one of the input arms is equally divided between the two output arms, with substantially complete isolation of the opposite input arm. This characteristic can be better understood by considering FIGS. 5 and 6 which schematically show the distribution of the electric fields in the apertured section of the hybrid when an input signal having a symmetric ($TE_{10}$) electric field is incident on the input arm 20. The arrows in FIGS. 5 and 6 indicate the direction of the electric field and the lengths of the arrows indicate the field intensity. The energy incident on the input terminal 20 of the hybrid reaches the apertured section and is there divided between the $TE_{10}$ mode and the $TE_{20}$ mode. The $TE_{10}$ mode shown in the apertured section of FIG. 5 is the lowest mode which may propagate in a rectangular waveguide having this width, it being known that the next symmetrical mode, the $TE_{30}$ mode, must not be allowed to propagate in the apertured section. For the frequency and waveguide sizes in common use, this requires some means of filtering out the $TE_{30}$ mode in the apertured section. This is accomplished in the preferred embodiment of the invention by the indentations 7 and 8 of the apertured section, as shown in FIGS. 1 and 2. The indentations reduce the width of the apertured section to less than $3/2\lambda$ where $\lambda$ is the free space wavelength of the highest operating frequency of the hybrid. By thus reducing the width of the apertured section, the $TE_{30}$ mode is effectively suppressed. For some frequencies and guide sizes, indentations or other mode suppressing means are not required, the guide width itself being such that the $TE_{30}$ mode will not propagate in the apertured section. FIG. 6 illustrates the $TE_{20}$ mode in the apertured section of the hybrid. It is evident from that figure that the field configuration is anti-symmetrical about the center wall 4. For this mode, the electric field in the connecting aperture 5 is zero, that is, no electric field component is present in the longitudinal center of the apertured section. When power is incident on the input terminal 20, it proceeds along the input arm until it encounters the apertured section and there the energy begins to cross over into the other waveguide. Under suitable conditions, by the time the electromagnetic energy reaches the end of the apertured section it will have divided so that the power leaving at output terminal 21 just equals that leaving at output terminal 22. The guide wavelength of the symmetric $TE_{10}$ mode is less than the guide wavelength in the anti-symmetric $TE_{20}$ mode in the apertured section. The length of the apertured section measured in electrical degrees for the symmetrical $TE_{10}$ mode exceeds its electrical length as measured for the anti-symmetric $TE_{20}$ mode by 90°. Consequently, as the energy in the two modes traverses the apertured section of the hybrid, a relative phase shift of 90° between the two modes ensues. Once the apertured section has been passed, the relative phases of the two modes are fixed. By coupling a resonant cavity to the energy of one of the modes in the apertured section, the 90° phase difference between the $TE_{10}$ mode and the $TE_{20}$ mode can be altered. By providing a coupling slot in the center of the top broad wall of the junction, as best shown in FIG. 3, a resonant cavity can be coupled to either the $TE_{10}$ mode or the $TE_{20}$ mode, depending on the orientation of the slot in the broad wall. When the cavity is at resonance, it does not shift the phase of the transmitted signal of the mode to which it is coupled even though it introduces some loss. On the other hand, on each side of resonance the cavity causes the phase of the transmitted signal of the mode to which it is coupled to be shifted in one direction for frequencies below resonance and in the opposite direction for frequencies above resonance. The effect of the resonant cavity upon the operation of the hybrid junction can be better understood by considering the vector diagrams of FIG. 7 in conjunction with the apparatus of FIG. 2. Assuming that the frequency of the input signal incident on waveguide 12 of FIG. 2 is at the resonant frequency of the cavity 10 and that the cavity is coupled by the slot 9 to the $TE_{20}$ mode, the energy in the input signal will divide evenly between output arm A and output arm B. Since the hybrid causes a 90° phase difference between the $TE_{10}$ mode and the $TE_{20}$ mode and the cavity at resonance does not affect that phase difference, the energy in output arm A is the vector sum of the energy in the $TE_{10}$ mode and the energy in the $TE_{20}$ mode as shown in FIG. 7A. Similarly, the energy delivered to output arm B is the vector sum of the $TE_{10}$ mode and the $TE_{20}$ mode energies incident on that arm and is depicted by vectors in FIG. 7B. The resultant $R_1$ of FIG. 7A and the resultant $R_2$ of FIG. 7B are equal signifying that the electro-magnetic energy is equally divided between output arms A and B. Where the frequency of the input signal is below the resonant frequency of the cavity 10, the cavity causes the phase of the $TE_{20}$ mode to be shifted relative to the phase of the $TE_{10}$ mode so that power is no longer equally divided between output arms A and B as indicated by the vector diagrams of FIGS. 7C and 7D which show that the energy delivered to output arm B, represented by resultant $R_2$, is greater than the energy delivered to output arm A which is represented by resultant $R_1$. Where the frequency of the input signal is above resonance, the cavity 10 causes the phase of the $TE_{20}$ mode to be shifted relative to the phase of the $TE_{10}$ mode so that more power is delivered to the output arm A, than is delivered to output arm B, as indicated by the difference in magnitude of the resultant $R_1$ of FIG. 7E when compared with the resultant $R_2$ of FIG. 7F. By employing crystals 16 and 17 to detect the signals obtained from the output arms A and B and measuring the difference between the currents and the two crystals, there is obtained as a function of frequency the characteristic discriminator S curve shown in FIG. 8. At the resonant frequency $f_0$ of the reference cavity 10 the output obtained from the discriminator is zero, while about that point, the output rises and falls in typical discriminator fashion. Detectors 16 and 17 are preferably silicon or germanium diodes and are located in waveguide sections 13 and 15, those waveguide sections preferably being terminated in a manner preventing the reflection of energy. Detectors 16 and 17 are arranged to give output currents of opposite polarity. A simple summing circuit which consists of the potentiometer 18 having its resistive element connected between the two crystals provides a signal $E_0$ at output terminal 19 which has the desired discriminator characteristic. Alternatively, detectors 16 and 17 may be arranged to give output signals of like polarity and a combining circuit in a form of a simple subtractor may be used to provide the output $E_0$. Further, it is evident that signals obtained from output arms A and B may be amplified by means of traveling wave tubes or other microwave amplification devices and that the amplified signals may then be detected to yield the discriminator output.

A frequency discriminator constructed in accordance with this invention can be employed to stabilize a source of microwave oscillation. When so employed, a small portion of the oscillator's output is coupled to the input waveguide 12. The energy transmitted to input waveguide 12 propagates into the hybrid junction 1 where it excites the $TE_{10}$ mode and the $TE_{20}$ mode as previously described. The outputs of opposite polarity crystal detectors 16 and 17 are summed by a potentiometer and the summation signal is supplied as the input to a D.C. amplifier. The discriminator output is enhanced by the D.C. amplifier and is utilized in a feedback loop to control the frequency of the microwave oscillator. Where the microwave oscillator is a conventional klystron tube, the feedback control loop may be connected to apply the correctional signal to the klystron's repeller electrode. This closed stabilization loop will, accordingly, maintain the klystron's frequency at $f_0$, the resonant frequency of the tunable cavity 10. Where the microwave oscillator is a voltage controlled device such as a backward wave tube, the correctional signal from the feedback loop is applied to the voltage controlling electrode, the anode in the case of "M" type backward wave tubes.

When operating a frequency discriminator constructed in accordance with the invention, it may become necessary to compensate for actual differences in the transmission factors of the microwave components resulting, for example, from a lack of precise symmetry in the hybrid junction or from a mismatch of the detectors 16 and 17. To make such an adjustment, the frequency of cavity resonator 10 is de-tuned to a point such as $f_a$ in FIG. 8 and a signal having a frequency in the vicinity of $f_b$ is applied to the input of the discriminator. With the discriminator so widely de-tuned, its output $E_0$ should be 0. If 0 output is not obtained, adjustment is accomplished by trimming the potentiometer 18 to a point where the output is 0. The frequency of the cavity resonator is then returned to the region of $f_0$ and a balanced discriminator characteristic is obtained.

While a preferred embodiment of the invention is illustrated in the drawings, and has been described in the specifications, modifications which do not depart from the essence of the invention may be made and, indeed, are apparent to those knowledgeable in microwave circuits. For example, while cavity resonator 10 has been described as being coupled to either the $TE_{10}$ or the $TE_{20}$ mode, it is apparent that the coupling slot 9 may be arranged to couple the cavity resonator to both modes but in such a manner that the resonator has a greater effect upon the phase of one of those modes than it has on the other. Although the hybrid junction has been described as having a capacitive button 6, it is known that the apertured section may be matched in other ways so that the button can be eliminated. In view of the obvious modifications which may be made, it is intended that the invention not be limited by the precise structure which is illustrated but rather that the scope of the invention be construed in accordance with the appended claims.

What is claimed is:

1. Microwave apparatus comprising in combination: a hybrid junction of the type having an apertured section which supports $TE_{10}$ and $TE_{20}$ modes of electromagnetic energy propagation; a resonator; and means in one wall of said junction coupling said resonator to said apertured section whereby the phase difference between the energy in the two aforesaid modes is varied by said resonator as a function of frequency.

2. In combination: a hybrid junction comprising a hollow generally rectangular conductive structure formed by pairs of opposed broad and narrow walls, a conductive partition extending longitudinally through said structure intermediate said narrow walls, said partition thereby dividing said structure into first and second waveguides of substantially rectangular cross section, said partition having an aperture therein connecting said first and second waveguides, the length of said aperture and the width of said structure defining an apertured section capable of supporting both the $TE_{10}$ and the $TE_{20}$ modes of electromagnetic energy propagation; one of said walls having a slot therein providing an opening to said apertured section; and a cavity resonator coupled to said apertured section through said slot.

3. A microwave discriminator comprising, a hybrid junction of the type having an apertured section supporting the $TE_{10}$ and $TE_{20}$ modes of electromagnetic energy propagation, said junction having first and second output ports, an input waveguide connected to an input port of said junction, a cavity resonator, said junction having a slot coupling said cavity resonator to one of the aforesaid modes in said apertured section whereby the phase of the coupled mode relative to the phase of the other mode is varied by said cavity resonator as a function of the input signal frequency, and signal detector means coupled to said output ports.

4. A hybrid junction comprising a hollow rectangular structure having a partition extending longitudinally therein, the partition dividing the structure into first and second rectangular waveguides, the partition having an aperture therein connecting the first and second waveguides, the length of the aperture and the width of the structure defining an apertured section capable of supporting two modes of electromagnetic energy propagation, and means in one wall of said structure permitting coupling to the wave energy in the apertured section, the coupling means being arranged to provide greater coupling to one of the two aforesaid modes than to the other of those modes.

References Cited in the file of this patent

UNITED STATES PATENTS

| | | |
|---|---|---|
| 2,413,939 | Benware | Jan. 7, 1947 |
| 2,691,734 | Beck et al. | Oct. 12, 1954 |
| 2,886,705 | Smith et al. | May 12, 1959 |
| 2,905,902 | Strandberg | Sept. 22, 1959 |